US012597469B2

(12) United States Patent
Lee et al.

(10) Patent No.: US 12,597,469 B2
(45) Date of Patent: Apr. 7, 2026

(54) NONVOLATILE MEMORY DEVICE, STORAGE DEVICE INCLUDING THE SAME, AND METHOD OF TESTING NONVOLATILE MEMORY DEVICE

(71) Applicant: Samsung Electronics Co., Ltd., Suwon-si (KR)

(72) Inventors: Gangmin Lee, Suwon-si (KR); Jaehue Shin, Suwon-si (KR); Daeseok Byeon, Suwon-si (KR); Yongsung Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 273 days.

(21) Appl. No.: 18/367,677

(22) Filed: Sep. 13, 2023

(65) Prior Publication Data

US 2024/0331774 A1 Oct. 3, 2024

(30) Foreign Application Priority Data

Mar. 28, 2023 (KR) ......................... 10-2023-0040340

(51) Int. Cl.
| | |
|---|---|
| *G11C 16/04* | (2006.01) |
| *G11C 16/24* | (2006.01) |
| *G11C 16/26* | (2006.01) |
| *G11C 16/30* | (2006.01) |
| *G11C 29/10* | (2006.01) |

(52) U.S. Cl.
CPC ...... *G11C 16/0491* (2013.01); *G11C 16/0483* (2013.01); *G11C 16/24* (2013.01); *G11C 16/26* (2013.01); *G11C 16/30* (2013.01); *G11C 29/10* (2013.01)

(58) Field of Classification Search
CPC . G11C 16/0491; G11C 16/0483; G11C 16/24; G11C 16/26; G11C 16/30; G11C 29/10
See application file for complete search history.

(56) References Cited

U.S. PATENT DOCUMENTS

| | | | |
|---|---|---|---|
| 6,862,232 | B2 | 3/2005 | Hanzawa et al. |
| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,536,970 | B2 | 1/2017 | Seol et al. |
| 10,474,585 | B2 * | 11/2019 | Lee ..................... G06F 12/1009 |

(Continued)

FOREIGN PATENT DOCUMENTS

| | | |
|---|---|---|
| KR | 100634458 B1 | 10/2006 |
| KR | 1020090025537 A | 3/2009 |

(Continued)

*Primary Examiner* — Pho M Luu
(74) *Attorney, Agent, or Firm* — Muir Patent Law, PLLC

(57) ABSTRACT

A nonvolatile memory device may include a page buffer, a control signal generator, and a current mirror. The page buffer may be connected to a bitline and may allow a replicated current to flow through a ground terminal in response to a first control signal and a second control signal. The control signal generator may output the first control signal and the second control signal to the page buffer. The current mirror may output, in a virtual cell mode, a control voltage corresponding to a bias current. The control voltage may correspond to the first control signal.

20 Claims, 14 Drawing Sheets

(56)          References Cited

U.S. PATENT DOCUMENTS

| | | | |
|---|---|---|---|
| 11,232,023 B2 * | 1/2022 | Lee ..................... | G06F 12/0873 |
| 11,600,350 B2 | 3/2023 | Kim et al. | |
| 2007/0002631 A1 | 1/2007 | Kang et al. | |
| 2014/0354260 A1 | 12/2014 | Kwon | |
| 2016/0027485 A1 | 1/2016 | Park et al. | |
| 2022/0130437 A1 | 4/2022 | Park et al. | |
| 2022/0139483 A1 | 5/2022 | Park et al. | |
| 2022/0139484 A1 | 5/2022 | Kim et al. | |
| 2023/0153205 A1 | 5/2023 | Shin et al. | |
| 2023/0335214 A1 * | 10/2023 | Chiu ........................ | G11C 5/14 |

FOREIGN PATENT DOCUMENTS

| | | |
|---|---|---|
| KR | 1020140141131 A | 12/2014 |
| KR | 1020220056919 A | 5/2022 |
| KR | 1020220058753 A | 5/2022 |
| KR | 1020220060572 A | 5/2022 |
| KR | 1020220103227 A | 7/2022 |

* cited by examiner

S110

S120

NONVOLATILE MEMORY DEVICE, STORAGE DEVICE INCLUDING THE SAME, AND METHOD OF TESTING NONVOLATILE MEMORY DEVICE

CROSS-REFERENCE TO RELATED APPLICATION(S)

This application claims benefit of priority to Korean Patent Application No. 10-2023-0040340 filed on Mar. 28, 2023 in the Korean Intellectual Property Office, the disclosure of which is incorporated herein by reference in its entirety.

BACKGROUND

The present inventive concept relates to a nonvolatile memory device, a storage device including the same, and a method of testing the same.

In general, storage devices including nonvolatile memory devices have been widely used in universal serial bus (USB) drives, digital cameras, mobile phones, smartphones, tablets, personal computers, memory cards, solid state drives (SSDs), and the like. Storage devices have been usefully used to store or move a large amount of data. According to the demand for high capacity and miniaturization of nonvolatile memory devices, three-dimensional (3D) memory devices in which a memory cell array and a peripheral circuit are arranged in a vertical direction have been developed. To improve productivity of nonvolatile memory devices, it is important to improve verifying a current sensing operation in the peripheral circuit without the memory cell array.

SUMMARY

An aspect of the present inventive concept provides a nonvolatile memory device for confirming robustness of current sensing of a page buffer, a storage device having the same, and a method of testing the same.

According to an aspect of the present inventive concept, a nonvolatile memory device may include a page buffer, a control signal generator, and a current mirror. The page buffer may be connected to a bitline and may allow replicated current to flow through a ground terminal in response to a first control signal and a second control signal. The control signal generator may output the first control signal and the second control signal to the page buffer. The current mirror may output, in a virtual cell mode, a control voltage corresponding to a bias current. The control voltage may correspond to the first control signal.

According to another aspect of the present inventive concept, a storage device may include a nonvolatile memory package and a controller. The nonvolatile memory package may include at least one nonvolatile memory device. The at least one nonvolatile memory device may include a plurality of page buffers connected to a memory cell array through a plurality of bitlines. The controller may control the nonvolatile memory package. The at least one nonvolatile memory device may allow, in a virtual cell mode, a replicated current flowing through each of the plurality of page buffers by using a current mirror connected to a pad.

According to another aspect of the present inventive concept, a method of testing a nonvolatile memory device including a memory cell array connected to a page buffer through a bitline may include electrically connecting, in a virtual cell mode, a current mirror bias to a gate of a first control transistor of the page buffer, and applying a test signal, corresponding to the current mirror bias, to a gate of a second control transistor of the page buffer so as to bias a drain of the first control transistor.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described clearly and specifically such that a person skilled in the art easily could carry out example embodiments using the drawings.

In a nonvolatile memory device, a storage device including the same, and a method of testing the same according to an example embodiment of the present inventive concept, a cell current may be replicated to a page buffer. This replication helps to verify the robustness of current sensing, even without a memory cell. In this embodiment, a specific component of the page buffer, for example, a path connecting a current mirror bias to a gate, may be configured so that a bitline shielding transistor (referred to as SHLDT) operates in the same manner as a cell. A level of a bitline shut-off control signal (referred to as BLSHF), which is interlocked with a current flowing in the SHLDT, may be applied to the bitline shut-off transistor (referred to as BLSHFT). The nonvolatile memory device, according to this embodiment, may replicate a cell current through a current mirror connected to the SHLDT, even when there is no memory cell. Specifically, the nonvolatile memory device may interlock a voltage of the BLSHF with a current flowing in the SHLDT, thereby implementing a cell current in a subthreshold region with high consistency.

Figure 1:
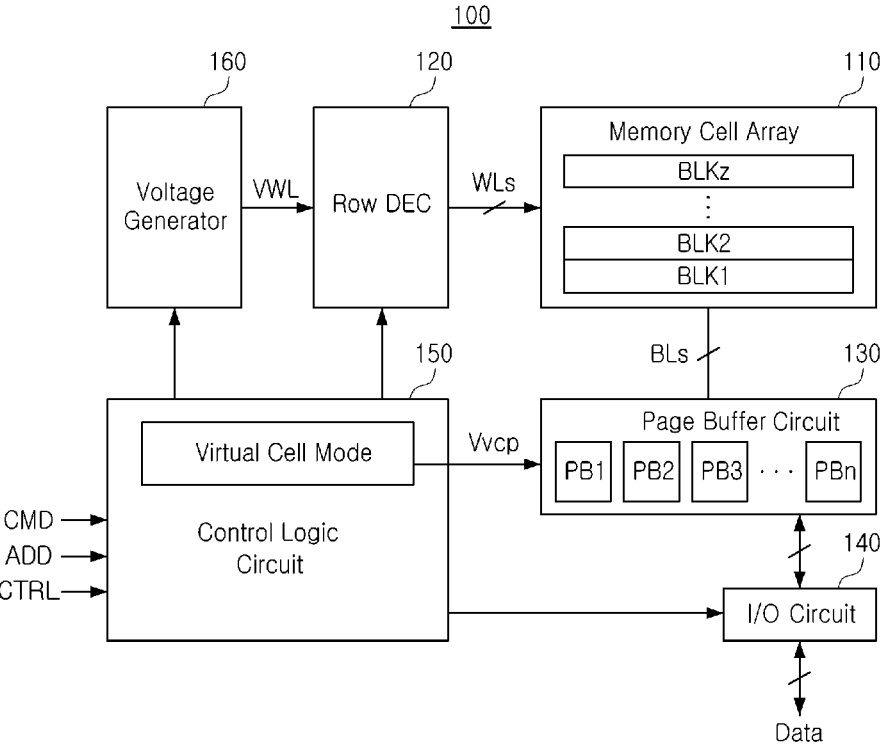
FIG. 1 is a diagram illustrating a nonvolatile memory device according to an example embodiment of the present inventive concept.

FIG. 1 is a diagram illustrating a nonvolatile memory device 100 according to an example embodiment of the present inventive concept. Referring to FIG. 1, the nonvolatile memory device 100 may include a memory cell array 110, a row decoder 120, a page buffer circuit 130, an input/output circuit 140, a control logic circuit 150, and a voltage generator 160.

The memory cell array 110 may be connected to the row decoder 120 through wordlines WLs, string selection lines SSLs and ground selection lines GSLs. The memory cell array 110 may be connected to the page buffer circuit 130 through bitlines BLs. The memory cell array 110 may include a plurality of cell strings. A channel of each of the cell strings may be formed in a vertical or horizontal direction. Each of the cell strings may include a plurality of memory cells. Here, the plurality of memory cells may be programmed, erased, or read by a voltage provided to the bitlines BLs or the wordlines WLs. In general, a program operation may be performed in units of pages, and an erase operation may be performed in units of blocks. Details of a memory cell will be described in U.S. Pat. Nos. U.S. Pat. Nos. 7,679,133, 8,553,466, 8,654,587, 8,559,235, and 9,536,970. In an example embodiment, the memory cell array 110 may include a 3D memory cell array, and the 3D memory cell array may include a plurality of NAND strings disposed in a row direction and a column direction.

The row decoder 120 may be implemented to select, in response to an address ADD, one of memory blocks BLK1 to BLKz (where z is an integer greater than or equal to 2) of the memory cell array 110. The row decoder 120 may select, in response to the address ADD, one of wordlines of the selected memory block. The row decoder 120 may transmit, to the selected wordline of the selected memory block, a wordline voltage VWL corresponding to an operation mode. During the program operation, the row decoder 120 may apply a program voltage and a verify voltage to the selected wordline, and may apply a pass voltage to an unselected wordline. During a read operation, the row decoder 120 may apply a read voltage to the selected wordline and a read pass voltage to the unselected wordline.

Herein, the nonvolatile memory device 100 may be performed in a normal operation mode (or a normal mode) such as the program, erase, or read operation, and performed in a test operation mode (or a test mode) such as a virtual cell operation mode (or a virtual cell mode).

The page buffer circuit 130 may be implemented to operate as a write driver or a sense amplifier. During the program operation, the page buffer circuit 130 may apply, to bitlines of the memory cell array 110, a bitline voltage corresponding to data to be programmed. During the read operation or a verification read operation, the page buffer circuit 130 may sense data stored in the selected memory cell through the bitline BL. Each of a plurality of page buffers PB1 to PBn (where n is an integer greater than or equal to 2), included in the page buffer circuit 130, may be connected to at least one bitline.

In a virtual cell mode, each of the plurality of page buffers PB1 to PBn may be implemented to receive a virtual cell control voltage Vvcp from the control logic circuit 150, and to flow through a virtual cell current according to the virtual cell control voltage Vvcp.

The input/output circuit 140 may provide externally provided data to the page buffer circuit 130. The input/output circuit 140 may provide, to the page buffer circuit 130, an externally provided input data. In addition, the input/output circuit 140 may externally output data sensed and latched by the page buffer circuit 130.

The control logic circuit 150 may be implemented to control, in response to a command CMD, an address ADD, and a control signal CTRL transmitted from an external device, the row decoder 120, the page buffer circuit 130, the input/output circuit 140, and the voltage generator 160. In addition, the control logic circuit 150 may be implemented to perform a dynamic read operation based on a cell count.

In addition, in the virtual cell mode, the control logic circuit 150 may be implemented to generate a virtual cell control voltage Vvcp. In an example embodiment, the virtual cell control voltage Vvcp may be generated using a current mirror. Here, in the virtual cell mode, the current mirror may be implemented to receive a current from a pad connected to the external device.

Under control of the control logic circuit 150, the voltage generator 160 may be implemented to generate various types of wordline voltages to be applied to respective wordlines and a well bias voltage to be supplied to a bulk (for example, a well region) in which memory cells are formed. The wordline voltages applied to the respective wordlines may include a program voltage, a pass voltage, a read voltage, a read pass voltage, and the like. Although not illustrated, the nonvolatile memory device 100 according to the present inventive concept may include a cell counter. The cell counter may be implemented to count memory cells, corresponding to a specific threshold voltage range, from data sensed by the page buffer circuit 130. For example, the cell counter may count the number of memory cells having a threshold voltage within a specific threshold voltage range by processing data sensed by each of the plurality of page buffers PB1 to PBn.

The nonvolatile memory device 100, according to an example embodiment of the present inventive concept, may generate a virtual cell control voltage (Vvcp) using a current mirror in a virtual cell mode. It may also replicate a cell current to each of the page buffers (PB1 to PBn) using the same virtual cell control voltage (Vvcp). In a test operation, the nonvolatile memory device 100 may operate a page buffer while replicating a cell current, even without a memory cell, utilizing the current mirror.

Figure 2:
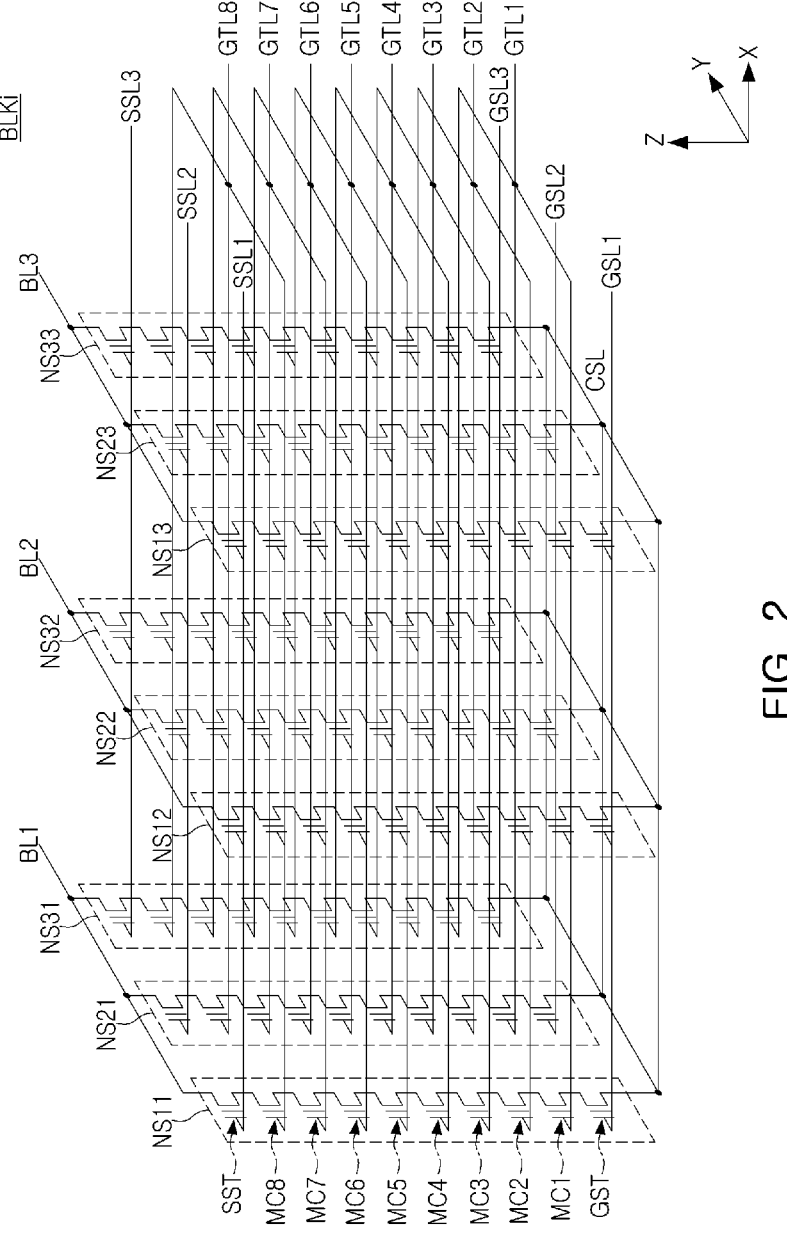
FIG. 2 is a circuit diagram illustrating a memory block in the nonvolatile memory device of FIG. 1 according to an example embodiment of the present inventive concept.

FIG. 2 is a circuit diagram illustrating a memory block BLKi (where i is an integer greater than or equal to 2) in the nonvolatile memory device 100 according to an example embodiment of the present inventive concept. A plurality of NAND strings, included in the memory block BLKi, may be formed in a direction, perpendicular to a substrate.

Referring to FIG. 2, the memory block BLKi may include a plurality of NAND strings NS11, NS21, NS31, NS12, NS22, NS32, NS13, NS23, and NS33 connected between bitlines BL1, BL2, and BL3 and a common source line CSL. Each of the plurality of NAND strings NS11, NS21, NS31, NS12, NS22, NS32, NS13, NS23, and NS33 may include a string selection transistor SST, a plurality of memory cells MC1, MC2, . . . , and MC8, and a ground selection transistor GST. FIG. 2 illustrates eight memory cells MC1, MC2, . . . , and MC8 in each of the plurality of NAND strings NS11, NS21, NS31, NS12, NS22, NS32, NS13, NS23, and NS33. However, it should be understood that the number of memory cells of the present inventive concept is not limited thereto.

The string selection transistor SST may be connected to corresponding string selection lines SSL1, SSL2, and SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may correspond to wordlines, and a portion of the gate lines GTL1, GTL2, . . . , and GTL8 may correspond to a dummy wordline. The ground selection transistor GST may be connected to corresponding ground selection lines GSL1, GSL2, and GSL3. The string selection transistor SST may be connected to corresponding bitlines BL1, BL2, and BL3, and the ground selection transistor GST may be connected to the common source line CSL.

Wordlines (for example, WL1) having the same height may be connected in common, and the ground selection lines GSL1, GSL2, and GSL3 and the string selection lines SSL1, SSL2, and SSL3 may be isolated from each other. The memory block BLKi, illustrated in FIG. 2, is illustrated as being connected to eight gate lines GTL1, GTL2, . . . , and GTL8 and three bitlines BL1, BL2, and BL3. However, it should be understood that the present inventive concept is not limited thereto.

Figure 3:
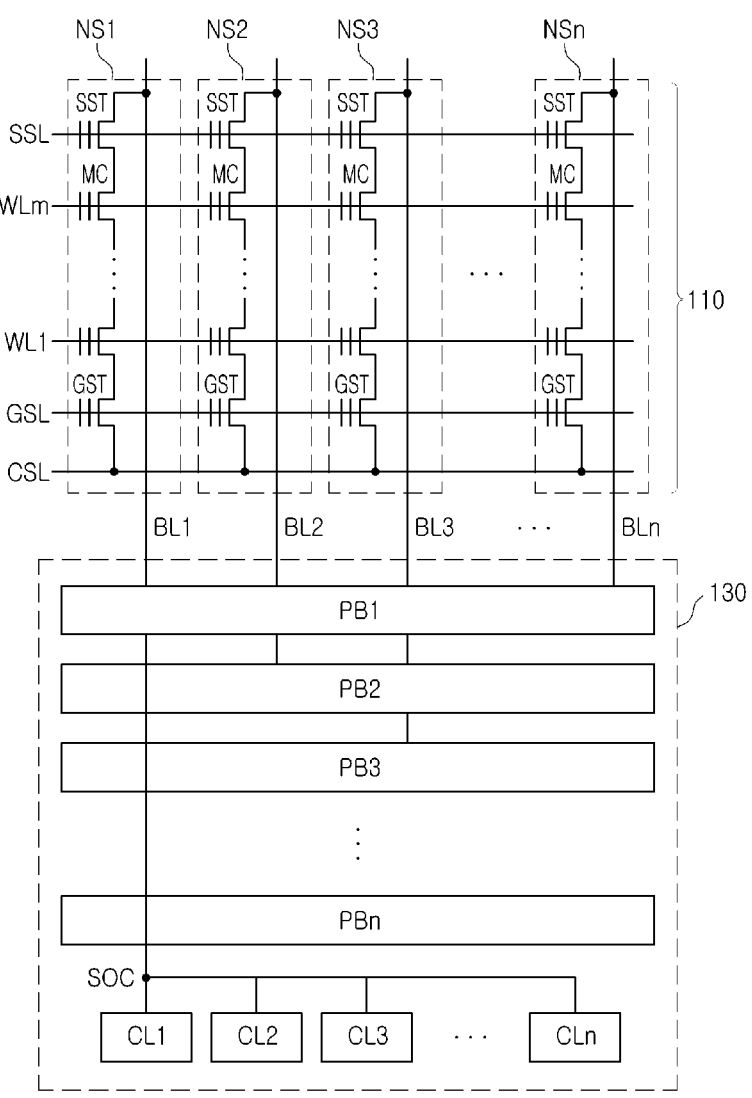
FIG. 3 is a diagram illustrating a connection relationship between a memory cell array and a page buffer circuit according to an example embodiment of the present inventive concept.

FIG. 3 is a diagram illustrating a connection relationship between a memory cell array 110 and a page buffer circuit 130 according to an example embodiment of the present inventive concept. Referring to FIG. 3, the memory cell array 110 may include first to n-th NAND strings NS1 to NSn (where n is an integer greater than or equal to 2). Each of the first to n-th NAND strings NS1 to NSn may include a ground selection transistor GST connected to a ground selection line GSL, a plurality of memory cells MC respectively connected to a plurality of wordlines WL1 to WLm (where m is an integer greater than or equal to 2), and a string selection transistor SST connected to a string selection line SSL. The ground selection transistor GST, the plurality of memory cells MC, and the string selection transistor SST may be connected to each other in series.

The page buffer circuit 130 may include first to n-th page buffers PB1 to PBn. A first page buffer PB1 may be connected to a first NAND string NS1 through a first bitline BL1, and an n-th page buffer PBn may be connected to an n-th NAND string NSn through an n-th bitline BLn. For example, n may be 8, and the page buffer circuit 130 may have a structure in which eight-stage page buffers PB1 to PBn are disposed in a row. For example, the first to n-th page buffers PB1 to PBn may be disposed in a row in a direction of extension of the first to n-th bitlines BL1 to BLn.

The page buffer circuit 130 may further include first to n-th cache latches CL1 to CLn respectively corresponding to the first to n-th page buffers PB1 to PBn. The page buffer circuit 130 may have a structure in which eight-stage cache latches CL1 to CLn are disposed in a row. For example, the first to n-th cache latches CL1 to CLn may be disposed in a row in a direction of extension of the first to n-th bitlines BL1 to BLn. Sensing nodes of the first to n-th page buffers PB1 to PBn may be connected to a coupling sensing node SOC in common. In addition, the first to n-th cache latches CL1 to CLn may be connected to the coupling sensing node SOC in common. Accordingly, the first to n-th page buffers PB1 to PBn may be connected to the first to n-th cache latches CL1 to CLn through the coupling sensing node SOC.

The nonvolatile memory device 100 according to an example embodiment of the present inventive concept may be implemented to replicate, in a virtual cell mode, a cell current to a specific component in a page buffer. For example, the specific component may be a shielding circuit for protecting the page buffer.

Figure 4:
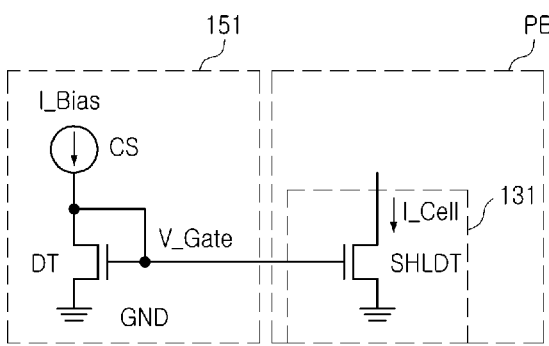
FIG. 4 is a diagram illustrating a current mirror connected to a shielding circuit of a page buffer according to an example embodiment of the present inventive concept.

FIG. 4 is a diagram illustrating a current mirror 151 connected to a shielding circuit 131 of a page buffer PB according to an example embodiment of the present inventive concept. Referring to FIG. 4, in a virtual cell mode, the current mirror 151 may be connected to the shielding circuit 131 of the page buffer PB. For example, each of the plurality of page buffers PB1 to PBn may include the shielding circuit 131.

The shielding circuit 131 may include a bitline shielding transistor SHLDT. The bitline shielding transistor SHLDT may be connected between the page buffer and a ground terminal GND. In an example embodiment, the bitline shielding transistor SHLDT may include an N-channel metal oxide semiconductor (NMOS) transistor.

The current mirror 151 may include a diode transistor (i.e., NMOS diode transistor) DT connected between a current source CS and the ground terminal GND. A gate and a drain of the diode transistor DT may be connected to each other. In an example embodiment, the diode transistor DT may include an NMOS transistor. Here, the current source CS may provide a bias current I_Bias. In this case, the bias current I_Bias may be provided from a pad connected to an external device or may be provided through an internal circuit of the nonvolatile memory device 100.

In the virtual cell mode, the gate of the diode transistor DT may be connected to a gate of the bitline shielding transistor SHLDT. A voltage V_Gate (virtual cell control voltage Vvcp of FIG. 1) of the gate of the diode transistor DT may be determined according to a value of the bias current I_Bias. In this case, the bias current I_Bias may be adjusted from the external device or may be internally adjusted. Accordingly, a desired replicated current I_Cell may flow through the bitline shielding transistor SHLDT.

In addition, the replicated current I_Cell, flowing through the bitline shielding transistor SHLDT, may be determined due to width/length of the diode transistor DT of the current mirror 151 and width/length/multi ratio of the bitline shielding transistor SHLDT of the page buffer PB. Further, the replicated current I_Cell may be determined due to multi ratio of the diode transistor DT. For example, the current mirror 151 may include p diode transistors DT (where p is an integer greater than or equal to 2) connected in parallel to each other.

Figure 5:
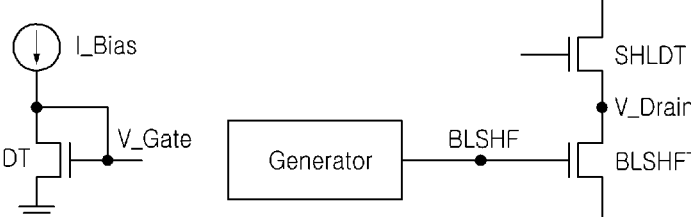
FIG. 5 is a diagram illustrating a drain bias of a bitline shut-off transistor applied to a gate voltage of a bitline shielding transistor in a page buffer according to an example embodiment of the present inventive concept.

FIG. 5 is a diagram illustrating a drain bias of a bitline shielding transistor SHHLDT applied through a gate voltage of a bitline shut-off transistor BLSHFT in a page buffer according to an example embodiment of the present inventive concept.

A memory cell current may be included in a current region when operating at a subthreshold of the bitline shielding transistor SHLDT. In order to copy an replicated current having high consistency, a drain voltage V_Drain as well as a gate voltage V_Gate of the bitline shielding transistor SHLDT may need to be biased to be equal to those of a diode transistor DT. In an example embodiment, a drain of the bitline shielding transistor SHLDT may be directly forced. In general, in a sensing operation, the drain of the bitline shielding transistor SHLDT is connected to a bitline, and thus the drain voltage may be determined by the bitline shut-off transistor BLSHFT. Accordingly, a voltage applied to a gate of the bitline shut-off transistor BLSHFT may be controlled, as illustrated in FIG. 5 without directly forcing the drain voltage V_Drain, thereby allowing the drain voltage V_Drain of the bitline shielding transistor SHLDT to be equal to the gate voltage V_Gate.

As described above, the nonvolatile memory device 100 according to an example embodiment of the present inventive concept may control the gate voltage V_Gate and drain voltage V_Drain of the bitline shielding transistor SHLDT, thereby replicating a cell current in a subthreshold region.

Figure 6:
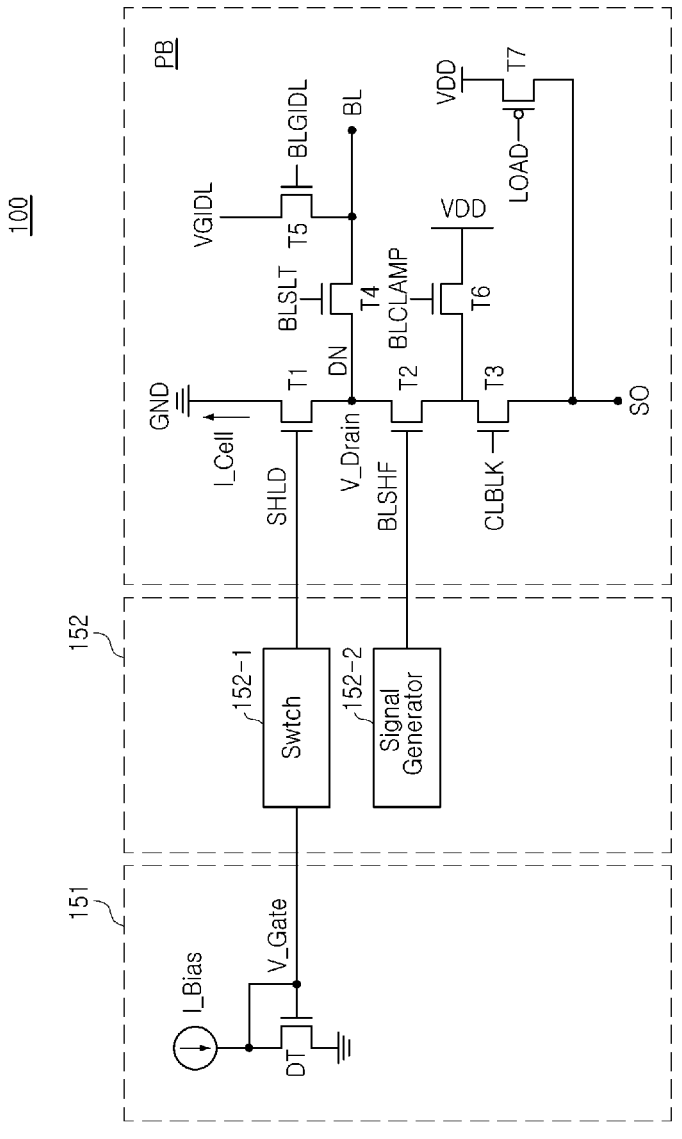
FIG. 6 is a schematic circuit diagram illustrating a virtual cell mode operation in a nonvolatile memory device according to an example embodiment of the present inventive concept.

FIG. 6 is a schematic circuit diagram illustrating a virtual cell mode in the nonvolatile memory device 100 according to an example embodiment of the present inventive concept. Referring to FIG. 6, the nonvolatile memory device 100 may include a plurality of page buffers, a current mirror 151 and a control signal generator 152.

In an embodiment, the current mirror 151 and the control signal generator 152 may be connected to the plurality of page buffers. In another embodiment, the current mirror 151 and the control signal generator 152 may be connected to a particular number of the plurality of page buffers.

Referring to FIG. 6, a page buffer PB may include transistors T1 to T7. Here, the page buffer PB is one of the plurality of page buffers PB1 to PBn. A transistor T1 (i.e., SHLDT) may be connected to a ground terminal GND in response to a bitline shielding control signal SHLD (or a first control signal). A transistor T2 (i.e., BLSHFT) may be connected to a drain node DN of the transistor T1 in response to a bitline shut-off control signal BLSHF (or a second control signal). Here, a drain voltage V_Drain may be provided to the drain node DN. A transistor T3 may be connected to a sensing node SO in response to a bitline connection control signal CLBLK. A transistor T4 may be connected to a bitline BL in response to a bitline selection signal BLSLT. In an embodiment, the transistor T4 may be turned off in the virtual cell mode. In another embodiment, the transistor T4 may be turned on to be connected to the bitline BL. In this case, the bitline BL may not be connect to any memory cell. For example, in the virtual cell mode, a sensing operation of a lower chip including a peripheral circuit region PERI (in FIG. 14) corresponding to a bitline may be performed without bonding an upper chip including a cell region CELL. A transistor T5 may be connected to a voltage terminal VGIDL in response to a bitline gate-induced drain leakage (GIDL) signal BLGIDL. A transistor T6 may be connected to a power supply terminal VDD in response to a bitline clamping control signal BLCLAMP so as to charge the sensing node SO.

The control signal generator 152 may include a switch 152-1 and a signal generator 152-2. In an embodiment, the control signal generator 152 may further include the current mirror 151.

A gate voltage V_Gate of a diode transistor DT of the current mirror 151 may be applied to a gate of a bitline shielding transistor SHLDT using the switch 152-1. For example, the switch 152-1 may provide the bitline shielding control signal SHLD, corresponding to the gate voltage V_Gate, to a gate of the transistor T1.

In order to increase consistency of current mirroring, width/length of the diode transistor DT of the current mirror 151 and width/length of the bitline shielding transistor SHLDT may be set to be equal to each other, and a mirroring ratio may be determined by a multi-factor (i.e., multi ratio). In order to allow the drain voltage V_Drain to be equal to the gate voltage V_Gate, a voltage level of the bitline shut-off control signal BLSHF may be controlled using the signal generator 152-2. The signal generator 152-2 may be also used in the normal operation mode. The drain voltage V_Drain may be adjusted according to the voltage level of the bitline shut-off control signal BLSHF. A sensing operation of sensing a bitline level may be implemented when a difference between a voltage of the BLSHF (V_BLSHF) and the drain voltage V_Drain corresponds to a threshold voltage Vth of the bitline shut-off transistor BLSHFT.

Figure 7:
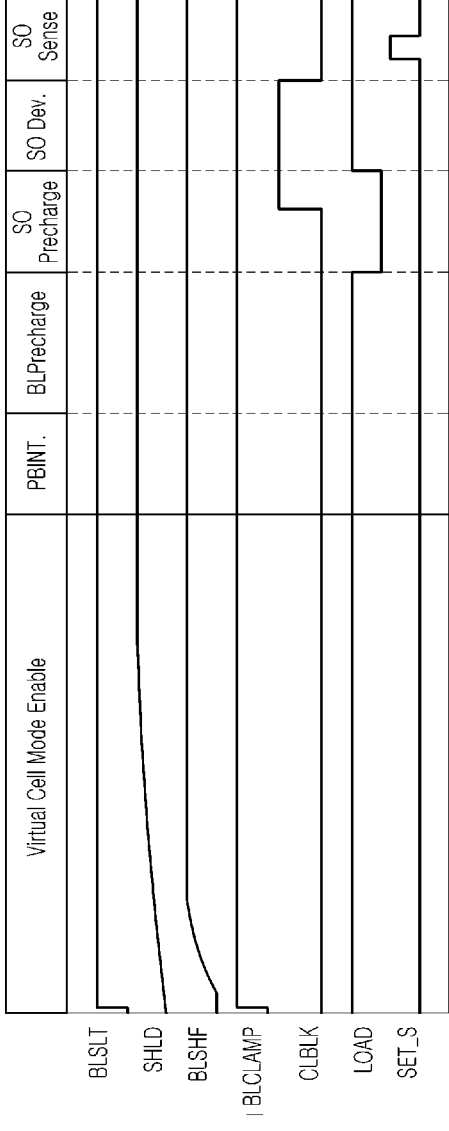
FIG. 7 is a diagram illustrating timings of a virtual cell mode enable operation and a sensing operation of a nonvolatile memory device according to an example embodiment of the present inventive concept.

FIG. 7 is a diagram illustrating timings of a virtual cell mode enable operation and a sensing operation of the nonvolatile memory device 100 according to an example embodiment of the present inventive concept. As illustrated in FIG. 7, control signals BLSLT, SHLD, BLCLAMP, CLBLK, LOAD, and SET_S may be set such that an replicated current I_Cell, copied to correspond to a mirroring ratio, flows through a page buffer during a virtual cell mode enable section. The sensing operation may be performed after voltages of the control signals BLSLT, SHLD, BLCLAMP, CLBLK, LOAD, and SET_S are set.

The sensing operation may be implemented as a page buffer initialization operation PBINT, a bitline precharging operation BLPrecharge, a sensing node precharging operation SO Precharge, a sensing node developing operation SO Dev, and a sensing node sensing operation SO Sense. A current corresponding to the replicated current I_Cell may be discharged at the sensing node SO, such that the developing operation SO Dev. may be performed. In the virtual cell mode, the nonvolatile memory device 100 according to an example embodiment of the present inventive concept may allow, using the bitline shielding transistor SHLDT, the replicated current I_Cell corresponding to a cell current to flow through the page buffer PB, thereby developing the sensing node SO. Although not shown, the control signal SET_S may activate a sensing latch of the page buffer PB for a sensing operation.

Figure 8:
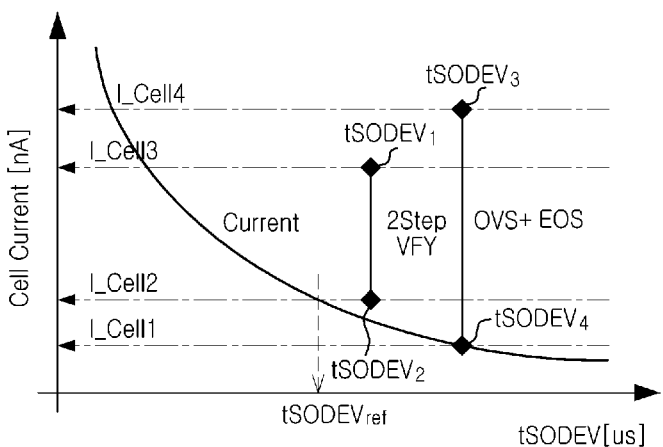
FIG. 8 is a diagram illustrating a relationship between a cell current and a development time of a sensing node in a nonvolatile memory device according to an example embodiment of the present inventive concept.

FIG. 8 is a diagram illustrating a relationship between a cell current and a development time of a sensing node in the nonvolatile memory device 100 according to an example embodiment of the present inventive concept. As illustrated in FIG. 8, in a sensing operation, the nonvolatile memory device 100 according to an example embodiment of the present inventive concept may use methods of varying a cell current, the method in which sensing is performed by varying a sensing node development time tSODEV. For example, the sensing operation may be used for a two-step verification operation, an on-chip valley search (OVS) operation, or the OVS and even-odd sensing (EOS) (OVS+ EOS) operation.

A general nonvolatile memory device may not vary or monitor a cell current corresponding to a Y axis. Thus, it may be difficult to identify a correlation between the development time tSODEV and the cell current. The nonvolatile memory device 100 according to an example embodiment of the present inventive concept may not only replicate but also control a cell current using a virtual cell mode, thereby securing cell current data, as illustrated in FIG. 8. Thus, the nonvolatile memory device 100 according to an example embodiment of the present inventive concept may identify a cell current corresponding to the development time tSODEV varying in the two-step verification operation, the OVS operation, or the OVS+EOS operation.

Referring to FIG. 8, in a normal mode other than the virtual cell mode, a cell current may be determined as I_cell2 at a development time tSODEVref. In an embodiment, in the virtual cell mode, the cell current may be determined as I_cell1 to I_cell4 when the development time tSODEV varies. For example, in the two-step verification operation, the cell current may be determined as I_cell2 at a development time tSODEV2 and determined as I_cell3 at a development time tSODEV1. In the OVS+EOS operation, the cell current may be determined as I_cell1 at a development time tSODEV4 and determined as I_cell4 at a development time tSODEV3. The development time tSODEV1 may be shorter than the development time tSODEV2, and the development time tSODEV3 may be shorter than the development time tSODEV4.

Figure 9:
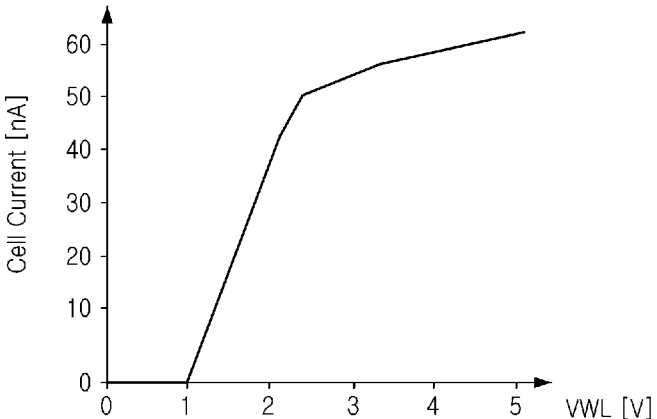
FIG. 9 is a diagram illustrating a relationship between a cell current and a cell threshold voltage of a nonvolatile memory device according to an example embodiment of the present inventive concept.

FIG. 9 is a diagram illustrating a relationship between a cell current and a wordline voltage VWL of the nonvolatile memory device 100 according to an example embodiment of the present inventive concept. Referring to FIGS. 8 and 9, when the development time tSODEV varies, a corresponding cell threshold voltage may be confirmed. Thus, not only may a current sensing operation be implemented in the absence of a memory cell, but also may a range of a development time (tSODEV) and a range of a cell current be confirmed in a current sensing method, thereby verifying robustness of the sensing method.

The nonvolatile memory device according to an example embodiment of the present inventive concept may simultaneously provide an replicated current to a plurality of page buffers through a single current mirror.

Figure 10:
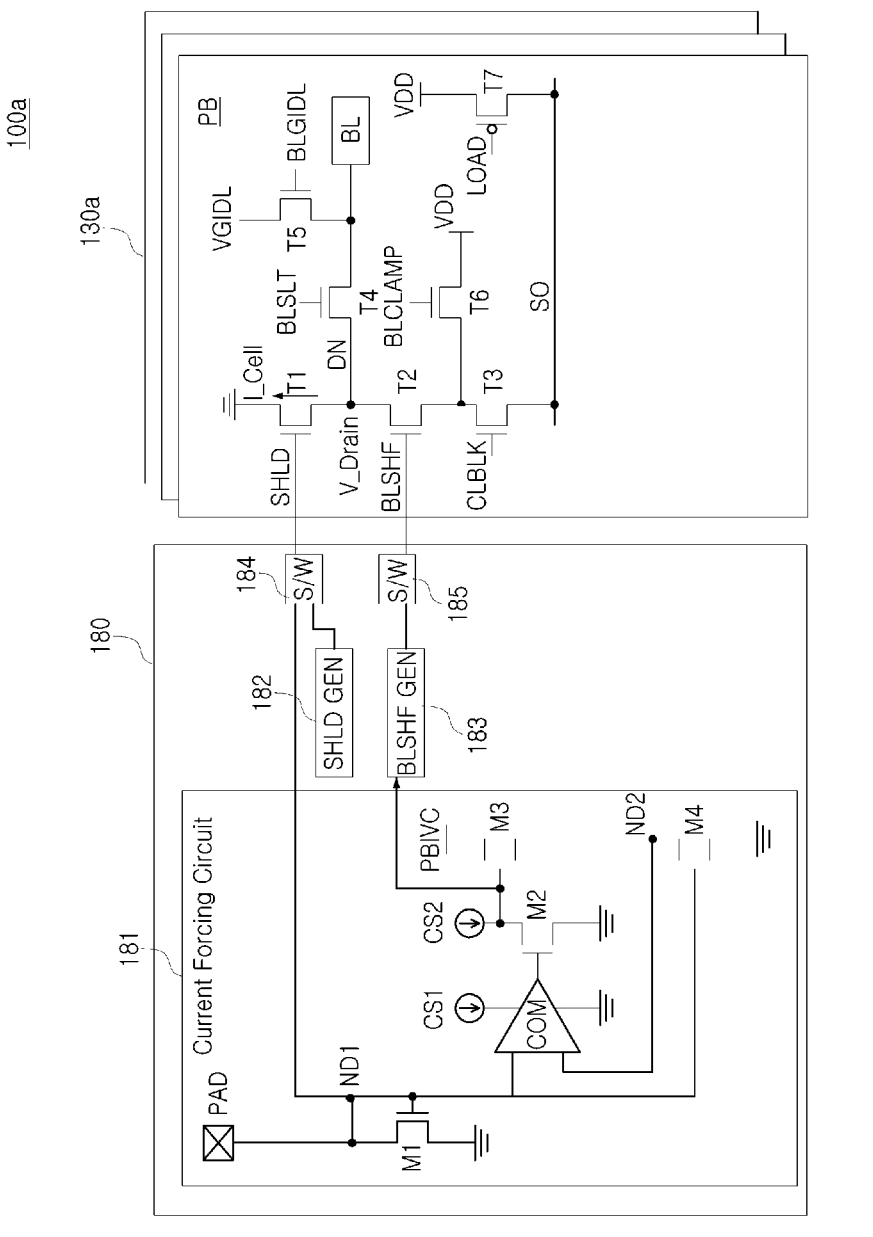
FIG. 10 is a schematic circuit diagram illustrating virtual cell mode operation of a nonvolatile memory device according to an example embodiment of the present inventive concept.

FIG. 10 is a schematic diagram illustrating virtual cell mode operation of a nonvolatile memory device according to an example embodiment of the present inventive concept. Referring to FIG. 10, a nonvolatile memory device 100a may include a plurality of page buffers 130a, and a peripheral circuit 180.

The peripheral circuit 180 may include a current forcing circuit 181, a first control signal generator (or a bitline shielding control signal generator) 182, a second control signal generator (or a bitline shut-off control signal generator) 183, a first switch 184, and a second switch 185.

The current forcing circuit 181 may include transistors M1 to M4, current sources CS1 and CS2, and a comparator COM. The current forcing circuit 181 may receive a current from a pad (PAD).

The first transistor M1 may include a drain and a gate connected in common to a first node ND1 connected to the PAD, and a source connected to a ground terminal. In an embodiment, the current forcing circuit 181 may include q first transistors M1 (where q is an integer greater than or equal to 2) connected in parallel to each other. A voltage of the first node ND1 may correspond to the virtual cell control voltage Vvcp of FIG. 1. In an embodiment, width/length of the first transistor M1 may be the same as width/length of the transistor T1 of the page buffer PB.

The second transistor M2 may include a drain connected to the current source CS2 and receiving a bitline shut-off control signal from the second control signal generator 183, a source connected to the ground terminal, and a gate receiving an output voltage of the comparator COM.

The third transistor M3 may include a drain connected to a second node ND2, a source connected to a power terminal (e.g., a page buffer internal voltage PBIVC), and a gate connected to the drain of the second transistor M2. In an embodiment, width/length of the third transistor M3 may be the same as width/length of the transistor T2 of the page buffer PB. In an embodiment, the current forcing circuit 181 may include r third transistors M3 (where r is an integer greater than or equal to 2) connected in parallel to each other.

The fourth transistor M4 may include a drain connected to the second node ND2, a source connected to the ground terminal, and a gate connected to the first node ND1. In an embodiment, the current forcing circuit 181 may include s fourth transistors M4 (where s is an integer greater than or equal to 2) connected in parallel to each other.

In an embodiment, a ratio of width/length of the first transistor M1 to width/length of the fourth transistor M4 may be the same as a ratio of width/length of the first transistor M1 to width/length of the third transistor M3.

The current forcing circuit 181 may be implemented to mirror a cell current in a subthreshold region to a page buffer PB, thereby confirming robustness of sensing of a sensing/latching operation. In an example embodiment, the PAD may be a dedicated pad for current forcing. In another example embodiment, the PAD may be a control signal pad or input/output pad, such as nRE, DQS, DQ, or the like used in an operating mode such as a program, a read, or an erase operating mode different from a virtual cell mode.

The first control signal generator 182 may output the bitline shielding control signal to the first switch 184. The first switch 184 may output one of the voltage of the first node ND1 and the bitline shielding control signal to the transistor T1. For example, the first switch 184 may output the voltage of the first node ND1 to the transistor T1 in the virtual cell mode, and output the bitline shielding control signal to the transistor T1 in the normal operation mode. The second control signal generator 183 may output the bitline shut-off control signal to the second switch 185 in response to a voltage of the drain of the second transistor M2 and the gate of third transistor M3. The second switch 185 may output the bitline shut-off control signal to the transistor T2. In an embodiment, the peripheral circuit 180 may not include the second switch 185. In this case, the second control signal generator 183 may directly output the bitline shut-off control signal to the transistor T2.

In the nonvolatile memory device 100a according to an example embodiment of the present inventive concept, gate/drain biases may be set to equal such that the cell current in the subthreshold region is replicated to bitline shielding transistors SHLDT of entire page buffers 130a with increased consistency.

The nonvolatile memory device 100a according to an example embodiment of the present inventive concept may verify, in a sensing/latching (S/L) operation, a sensing window of a sensing method (for example, two-step VFY and OVS+EOS) using a varying development time tSODEV through cell current replication.

The nonvolatile memory device 100a according to an example embodiment of the present inventive concept may replicate a subthreshold current to a bitline shielding transistor SHLDT of a page buffer PB, and may control a bitline voltage generated by a bitline shut-off control signal BLSHF, thereby performing a sensing operation. To this end, a gate voltage of a forcing current mirror, applied to a PAD, may be applied to a gate of the bitline shielding transistor SHLDT. In addition, the bitline shut-off control signal BLSHF, corresponding to a replication current, may be applied to a gate of the bitline shut-off transistor BLSHFT. Here, the bitline shut-off control signal BLSHF may be generated by the second control signal generator 183 for indirect biasing.

Figure 11:
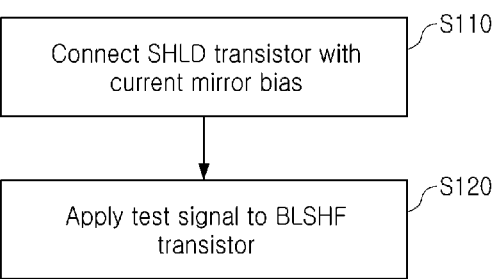
FIG. 11 is a flowchart illustrating a method of testing a nonvolatile memory device according to an example embodiment of the present inventive concept.

FIG. 11 is a flowchart illustrating a method of testing a nonvolatile memory device according to an example embodiment of the present inventive concept. Referring to FIGS. 1 to 11, the nonvolatile memory device 100 may perform a test operation as follows. In a virtual cell mode, a first control transistor (for example, a bitline shielding transistor SHLDT) of a page buffer may be connected to a current mirror bias (S110). A test signal may be applied to a gate of a second control transistor (for example, a bitline shut-off transistor BLSHFT) to confirm cell current robustness (S120).

In an example embodiment, a bias current, corresponding to a current mirror bias, may be received from a pad connected to an external device. In another example embodiment, the bias current, corresponding to the current mirror bias, may be generated in an internal circuit. In an example embodiment, a test signal (for example, a bitline shut-off control signal BLSHF), corresponding to the current mirror bias, may be generated. In an example embodiment, a sensing operation, corresponding to a bitline, may be performed without connection to a memory cell in the virtual cell mode.

Figure 12:
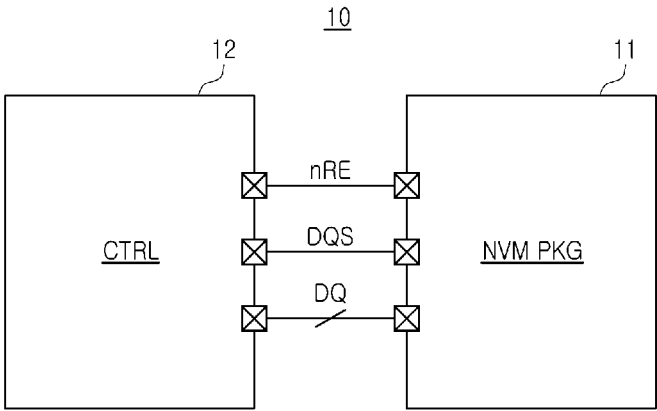
FIG. 12 is a diagram illustrating a storage device according to an example embodiment of the present inventive concept.

FIG. 12 is a diagram illustrating a storage device 10 according to an example embodiment of the present inventive concept. Referring to FIG. 12, the storage device 10 may include a nonvolatile memory package (NVM PKG) 11 and a controller (CTRL) 12 controlling the nonvolatile memory package 11.

The nonvolatile memory package (NVM PKG) 11 may include an interface chip (e.g., a frequency boosting interface chip (FBI) or buffer chip) and a plurality of nonvolatile memory devices connected to internal channels. The interface chip FBI may be connected to the controller 12 through a channel CH1. Here, the channel CH1 may be connected to a first internal channel or a second internal channel through an interface chip. The interface chip may include a retraining check circuit, internally determining the necessity for retraining. In an example embodiment, the retraining check circuit may include a built-in self-test (BIST) circuit, an oscillator, or a delayed locked loop (DLL) circuit. In addition, the interface chip may compatibly implement an interface protocol for communicating with the controller 12 and an interface protocol for communicating with nonvolatile memory devices. Each of the nonvolatile memory devices may be implemented to store data. The plurality of nonvolatile memory devices may be connected to each of the internal channels. In an example embodiment, the nonvolatile memory package 11 may be implemented to have a structure in which the nonvolatile memory devices are stacked. As described with reference to FIGS. 1 to 11, each of the plurality of nonvolatile memory devices may be implemented in the same manner as the nonvolatile memory device 100, replicating a virtual cell current to a page buffer in a virtual cell mode.

The controller (CTRL) 12 may be implemented to control overall operations of the nonvolatile memory package 11 through at least one control signal (for example, nRE), a data strobe signal (DQS), or a data signal (DQ). The controller 12 may perform functions necessary for data management of the nonvolatile memory package 11, such as address mapping, error correction, garbage collection, wear-leveling, bad block management, or data correction. Here, such functions may be implemented in terms of hardware, software, or firmware.

Figure 13:
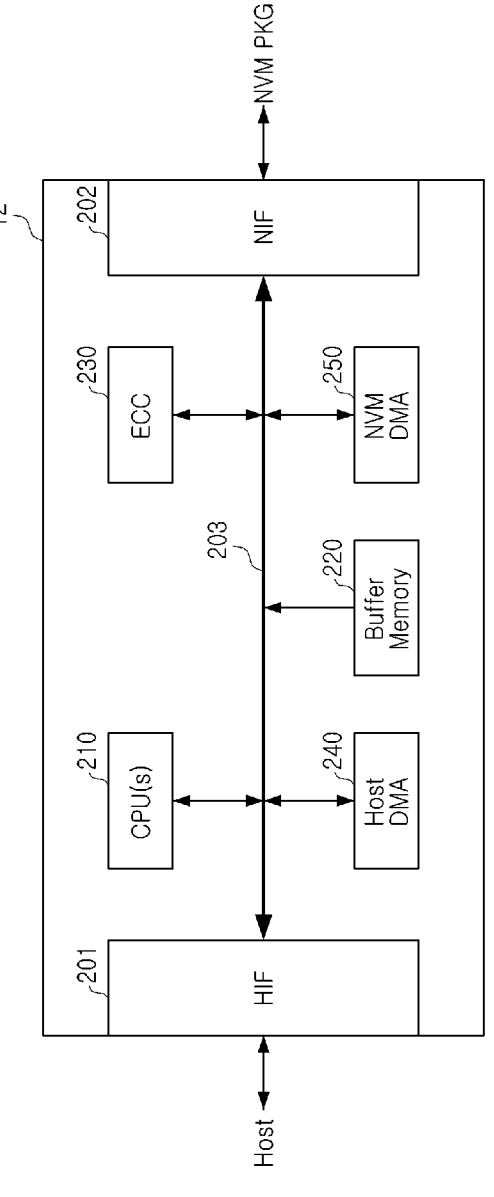
FIG. 13 is a diagram illustrating a controller according to an example embodiment of the present inventive concept.

FIG. 13 is a diagram illustrating the controller 12 of FIG. 12 according to an example embodiment of the present inventive concept. Referring to FIG. 13, the controller 12 may include a host interface circuit 201, a nonvolatile memory interface circuit 202, a bus 203, at least one processor (CPU(s)) 210, a buffer memory 220, an error correction circuit (ECC) 230, a host direct memory access (DMA) circuit 240, and a nonvolatile memory DMA circuit 250.

The host interface circuit 201 may be implemented to transmit and receive packets to and from a host. A packet, transmitted from the host to the host interface circuit 201, may include a command or data to be written to a nonvolatile memory device. The packet, transmitted from the host interface circuit 201 to the host, may include a response to a command or data read from the nonvolatile memory device.

The nonvolatile memory interface circuit 202 may transmit, to a nonvolatile memory device 100, data to be written to the nonvolatile memory device 100 or may receive data read from the nonvolatile memory device 100. The nonvolatile memory interface circuit 202 may be implemented to comply with a standard such as a joint electron device engineering council (JEDEC) or an open NAND flash interface (ONFI).

The at least one processor (CPU(s)) 210 may be implemented to control overall operations of the storage device 10. The processor 210 may perform various management operations such as cache/buffer management, firmware management, garbage collection management, wear leveling management, data deduplication management, read refresh/reclaim management, bad block management, multi-stream management, mapping management of host data and a nonvolatile memory, quality of service (QOS) management, system resource allocation management, nonvolatile memory queue management, read level management, erase/program management, hot/cold data management, power loss protection management, dynamic thermal management, initialization management, redundant array of inexpensive disk (RAID) management, and the like. Such management operations may be implemented in terms of hardware, firmware, or software.

The buffer memory 220 may temporarily store data to be written to the nonvolatile memory device or data read from the nonvolatile memory device. In an example embodiment, the buffer memory 220 may be a component included in the controller 12. In another example embodiment, the buffer memory 220 may be disposed outside the controller 12. In addition, the buffer memory 220 may be implemented as a volatile memory (for example, a static random access memory (SRAM), a dynamic RAM (DRAM), a synchronous DRAM (SDRAM), or the like) or a nonvolatile memory (a flash memory, a phase-change RAM (PRAM), a magneto-resistive RAM (MRAM), a resistive RAM (Re-RAM), a ferroelectric RAM (FRAM), or the like).

The error correction circuit 230 may be implemented to generate an error correction code when a program operation is performed, and to restore data using the error correction code when a read operation is performed. That is, the error correction circuit 230 may generate an error correction code (ECC) for correcting a fail bit or an error bit of data received from the nonvolatile memory device. In addition, the error correction circuit 230 may perform error correction encoding on data provided to the nonvolatile memory device, thereby forming data to which parity bits are added. The parity bits may be stored in the nonvolatile memory device.

In addition, the error correction circuit 230 may perform error correction decoding on data output from the nonvolatile memory device. The error correction circuit 230 may correct errors using parity. The error correction circuit 230 may correct errors using coded modulation such as a low-density parity check (LDPC) code, a BCH code, a turbo code, a Reed-Solomon code, a convolution code, a recursive systematic code (RSC), a trellis-coded modulation (TCM), a block coded modulation (BCM), or the like. When error correction by the error correction circuit 230 is not possible, a read retry operation may be performed.

The packet manager may generate a packet according to an interface protocol negotiated with the host or may parse various types of information from a packet received from the host. An encryption device may perform at least one of an encryption operation and a decryption operation on data input to the controller 12 using a symmetric-key algorithm. The encryption device may encrypt and decrypt data using an advanced encryption standard (AES) algorithm. The encryption device may include an encryption module and a decryption module. In an example embodiment, the encryption device may be implemented in terms of hardware, software, or firmware. The encryption device may perform a self-encryption disk (SED) function or a trusted computing group (TCG) security function. The SED function may store encrypted data in the nonvolatile memory device using an encryption algorithm or may decrypt the encrypted data from the nonvolatile memory device. The encryption/decryption operation may be performed using an internally generated encryption key. The TCG security function may provide a mechanism for enabling use of the storage device 10 and control of access to data. For example, the TCG security function may perform an authentication procedure between an external device and the storage device 10. In an example embodiment, the SED function or the TCG security function may be optionally selectable.

The host DMA circuit 240 may be implemented to control a DMA operation between a host device and the controller 12. The host DMA circuit 240 may store, in the buffer memory 220, data input from the host device through the host interface circuit 201 when the program operation is performed under the control of the host. In addition, the host DMA circuit 240 may perform an operation of outputting data, stored in the buffer memory 220, to the host device through the host interface circuit 201 when the read operation is performed. In an example embodiment, the host DMA circuit 240 may be implemented to be included in the host as a component of the host.

The nonvolatile memory DMA circuit 250 may be implemented to control a DMA operation between the controller 12 and the nonvolatile memory device. The nonvolatile memory DMA circuit 250 may perform an operation of outputting data, stored in the buffer memory 220, to the nonvolatile memory device through the nonvolatile memory interface circuit 202, when the program operation is performed, under the control of a nonvolatile memory controller (e.g., the processor CPU(s) 210). In addition, the nonvolatile memory DMA circuit 250 may perform an operation of reading data, stored in the nonvolatile memory device, through the nonvolatile memory interface circuit 202, when the read operation is performed.

The nonvolatile memory device according to an example embodiment of the present inventive concept may be implemented as a vertical memory device.

Figure 14:
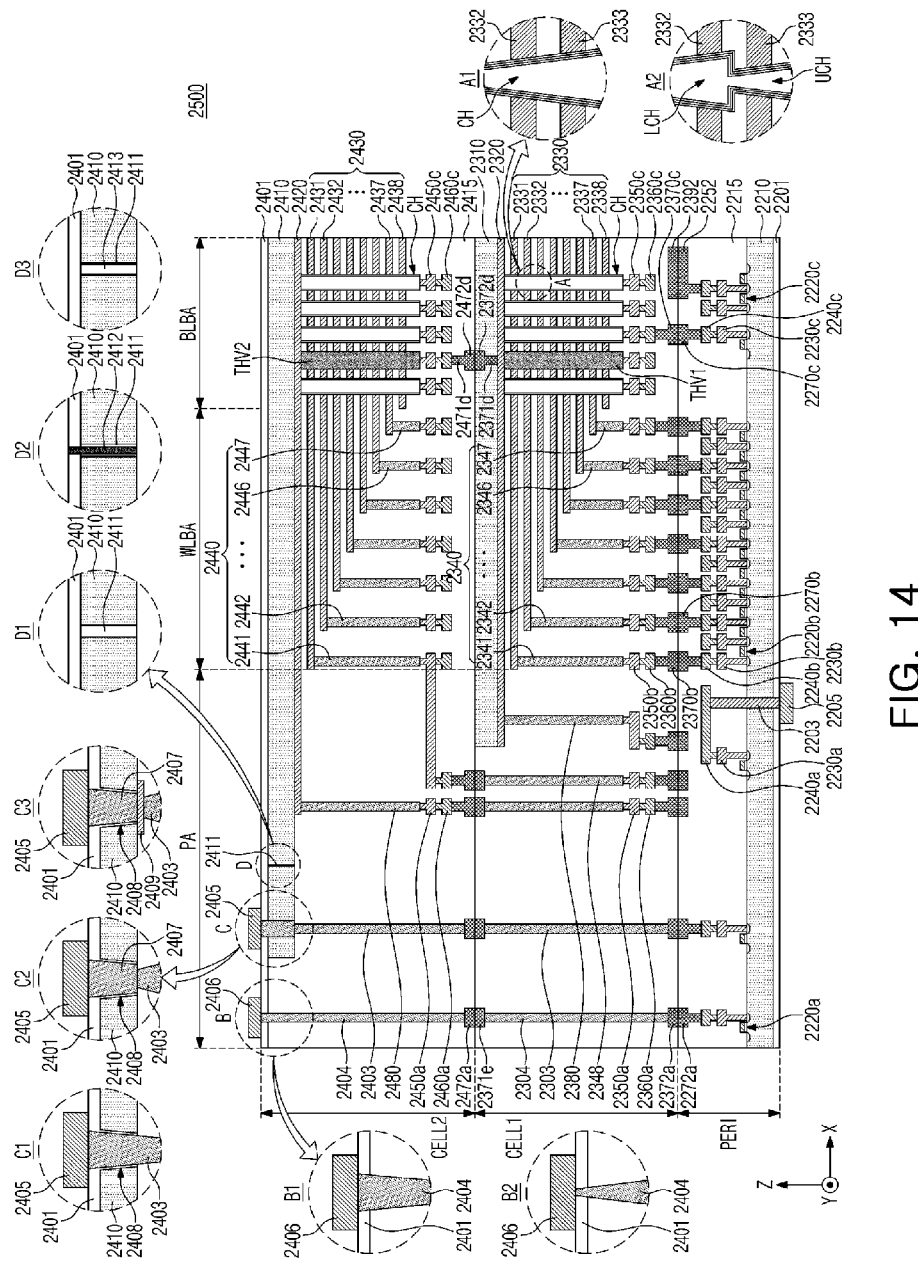
FIG. 14 is a diagram illustrating a nonvolatile memory device according to an example embodiment of the present inventive concept.

FIG. 14 is a diagram illustrating a nonvolatile memory device according to an example embodiment of the present inventive concept. Referring to FIG. 14, a nonvolatile memory device 2500 may have a chip to chip (C2C) structure. Here, the C2C structure may mean that at least one upper chip including a cell region CELL and at least one lower chip including a peripheral circuit region PERI are manufactured, respectively, and then the at least one upper chip and the at least one lower chip are connected to each other using a bonding method. In an example embodiment, the bonding method may refer to a method of electrically or physically connecting, to each other, a bonding metal pattern formed on an uppermost metal layer of an upper chip and a bonding metal pattern formed on an uppermost metal layer of a lower chip. For example, when the bonding metal patterns are formed of copper (Cu), the bonding method may be a Cu—Cu bonding method. In another example embodiment, the bonding metal patterns may also be formed of aluminum (Al) or tungsten (W).

The nonvolatile memory device 2500 may include at least one upper chip including a cell region. For example, as illustrated in FIG. 14, the nonvolatile memory device 2500 may be implemented to include two upper chips. However, such a configuration is exemplary, and the number of upper chips is not limited thereto. When the nonvolatile memory device 2500 is implemented to include two upper chips, a first upper chip including a first cell region CELL1, a second upper chip including a second cell region CELL2, and a lower chip including the peripheral circuit region PERI are respectively manufactured, the first upper chip, the second upper chip, and the lower chip may be connected to each other using the bonding method, such that the nonvolatile memory device 2500 may be manufactured. The first upper chip may be inverted and connected to the lower chip using the bonding method, and the second upper chip may also be inverted and connected to the first upper chip using the bonding method. In the following description, upper and lower portions of the first and second upper chips may be defined on the basis of a specific time before the first upper chip and the second upper chip are inverted. That is, in FIG. 14, an upper portion of the lower chip may refer to an upper portion defined with respect to +Z-axis direction, and an upper portion of each of the first and second upper chips may refer to an upper part defined with respect to a −Z-axis direction. However, such a configuration is exemplary, and only one of the first upper chip and the second upper chip may be inverted and connected using the bonding method.

Each of the peripheral circuit region PERI and the first and second cell regions CELL1 and CELL2 of the nonvolatile memory device 2500 may include an external pad bonding region PA, a wordline bonding region WLBA, and a bitline bonding region BLBA.

The peripheral circuit region PERI may include a first substrate 2210 and a plurality of circuit elements 2220a, 2220b, and 2220c formed on the first substrate 2210. An interlayer insulating layer 2215, including at least one insulating layer, may be provided on the plurality of circuit elements 2220a, 2220b, and 2220c. A plurality of metal interconnections connecting, to each other, the plurality of circuit elements 2220a, 2220b, and 2220c may be provided within the interlayer insulating layer 2215. For example, the plurality of metal interconnections may include first metal interconnections 2230a, 2230b, and 2230c respectively connected to the plurality of circuit elements 2220a, 2220b, and 2220c, and second metal interconnections 2240a, 2240b, and 2240c formed on the first metal interconnections 2230a, 2230b, and 2230c. The plurality of metal interconnections may be formed of at least one of various conductive materials. For example, the first metal interconnections 2230a, 2230b, and 2230c may be formed of tungsten having relatively high electrical resistivity, and the second metal interconnections 2240a, 2240b, and 2240c may be formed of copper having relatively low electrical resistivity.

Here, only the first metal interconnections 2230a, 2230b, and 2230c and the second metal interconnections 2240a, 2240b, and 2240c are illustrated and described, but the present inventive concept is not limited thereto, and at least one additional metal interconnection may be further formed on the second metal interconnections 2240*a*, 2240*b*, and 2240*c*. In this case, the second metal interconnections 2240*a*, 2240*b*, and 2240*c* may be formed of aluminum. In addition, at least a portion of the additional metal interconnections formed on the second metal interconnections 2240*a*, 2240*b*, and 2240*c* may be formed of copper or the like having electrical resistivity lower than that of aluminum of the second metal interconnections 2240*a*, 2240*b*, and 2240*c*.

The interlayer insulating layer 2215 may be disposed on the first substrate 2210, and may include an insulating material such as silicon oxide, silicon nitride, or the like.

Each of the first and second cell regions CELL1 and CELL2 may include at least one memory block. The first cell region CELL1 may include a second substrate 2310 and a common source line 2320. A plurality of wordlines 2330 (2331 to 2338) may be stacked on the second substrate 2310 in a direction (Z-axis direction), perpendicular to an upper surface of the second substrate 2310. String selection lines and a ground selection line may be disposed on upper portions and lower portions of the wordlines 2330, and the plurality of wordlines 2330 may be disposed between the string selection lines and the ground selection line. Similarly, the second cell region CELL2 may include a third substrate 2410 and a common source line 2420, and a plurality of wordlines 2430 (2431 to 2438) may be stacked in a direction (Z-axis direction), perpendicular to an upper surface of the third substrate 2410. The second substrate 2310 and the third substrate 2410 may be formed of or include various materials, for example, a silicon substrate, a silicon-germanium substrate, a germanium substrate, or a substrate having a monocrystalline epitaxial layer grown on a monocrystalline silicon substrate. A plurality of channel structures CH may be formed in each of the first and second cell regions CELL1 and CELL2.

In an example embodiment, as illustrated in A1, a channel structure CH may be provided to the bitline bonding region BLBA, and may extend in the direction, perpendicular to the upper surface of the second substrate 2310, to pass through the wordlines 2330, string selection lines, and a ground selection line. The channel structure CH may include a data storage layer, a channel layer, and a buried insulating layer. The channel layer may be electrically connected to a first metal interconnection 2350*c* and a second metal interconnection 2360*c* in the bitline bonding region BLBA. For example, the second metal interconnection 2360*c* may be a bitline, and may be connected to the channel structure CH through the first metal interconnection 2350*c*. A bitline 2360*c* may extend in a first direction (Y-axis direction), parallel to the upper surface of the second substrate 2310.

In an example embodiment, as illustrated in A2, the channel structure CH may include a lower channel LCH and an upper channel UCH, connected to each other. For example, the channel structure CH may be formed through a process for the lower channel LCH and a process for the upper channel UCH. The lower channel LCH may extend in a direction perpendicular to the upper surface of the second substrate 2310 to pass through the common source line 2320 and lower wordlines 2331 and 2332. In an embodiment, the lower channel LCH may not pass through the common source line 2320. The lower channel LCH may include a data storage layer, a channel layer, and a buried insulating layer, and may be connected to the upper channel UCH. The upper channel UCH may pass through upper wordlines 2333 to 2338. The upper channel UCH may include a data storage layer, a channel layer, and a buried insulating layer, and the channel layer of the upper channel UCH may be electrically connected to the first metal interconnection 2350*c* and the second metal interconnection 2360*c*. As a channel length increases, it may be difficult to form a channel having a predetermined width due to process reasons. The nonvolatile memory device 2500 according to an example embodiment of the present inventive concept may include a channel having improved width uniformity through the lower channel LCH and the upper channel UCH formed through a sequential process.

As illustrated in A2, when the channel structure CH is formed to include the lower channel LCH and the upper channel UCH, a wordline positioned in the vicinity of a boundary between the lower channel LCH and the upper channel UCH is a dummy wordline. For example, a wordline 2332 and a wordline 2333, forming the boundary between the lower channel LCH and the upper channel UCH, may be dummy wordlines. In this case, data may not be stored in memory cells connected to the dummy wordline. Alternatively, the number of pages, corresponding to the memory cells connected to the dummy wordline, may be less than the number of pages corresponding to memory cells connected to a general wordline. A voltage level applied to the dummy wordline may be different from a voltage level applied to the general wordline, thereby reducing the effect of a non-uniform channel width between the lower channel LCH and the upper channel UCH on an operation of the memory device.

In A2, the number of lower wordlines 2331 and 2332 through which the lower channel LCH passes is less than the number of upper wordlines 2333 to 2338 through which the upper channel UCH passes. However, such a configuration is exemplary, and the present inventive concept is not limited thereto. In another example embodiment, the number of lower wordlines, passing through the lower channel LCH, may be equal to or greater than the number of upper wordlines, passing through the upper channel UCH. In addition, the above-described structure and connection relationship of the channel structure CH disposed in the first cell region CELL1 may be applied to the channel structure CH disposed in the second cell region CELL2 in the same manner.

In the bitline bonding region BLBA, a first through-electrode THV1 may be provided in the first cell region CELL1, and a second through-electrode THV2 may be provided in the second cell region CELL2. As illustrated in FIG. 14, the first through-electrode THV1 may pass through the plurality of wordlines 2330. In an embodiment, the first through-electrode THV1 may pass through the common source line 2320. However, such a configuration is exemplary, and the first through-electrode THV1 may further pass through the second substrate 2310. The first through-electrode THV1 may include a conductive material. Alternatively, the first through-electrode THV1 may include a conductive material surrounded by an insulating material. The second through-electrode THV2 may also have a shape and structure the same as those of the first through-electrode THV1.

In an example embodiment, the first through-electrode THV1 and the second through-electrode THV2 may be electrically connected through the first through-metal pattern 2372*d* and the second through-metal pattern 2472*d*. The first through-metal pattern 2372*d* may be formed on a lower end of a first upper chip including the first cell region CELL1, and the second through-metal pattern 2472*d* may be formed on an upper end of a second upper chip including the second cell region CELL2. The first through-electrode THV1 may be electrically connected to the first metal interconnection 2350c and the second metal interconnection 2360c. A lower via 2371d may be formed between the first through-electrode THV1 and the first through-metal pattern 2372d, and an upper via 2471d may be formed between the second through-electrode THV2 and the second through-metal pattern 2472d. The first through-metal pattern 2372d and the second through-metal pattern 2472d may be connected to each other using a bonding method.

In addition, in the bitline bonding region BLBA, an upper metal pattern 2252 may be formed on an uppermost metal layer of the peripheral circuit region PERI, and an upper metal pattern 2392, having a shape the same as that of the upper metal pattern 2252, may be formed on an uppermost metal layer of the first cell region CELL1. The upper metal pattern 2392 of the first cell region CELL1 and the upper metal pattern 2252 of the peripheral circuit region PERI may be electrically connected to each other using the bonding method. In the bitline bonding region BLBA, the bitline 2360c may be electrically connected to a page buffer included in the peripheral circuit region PERI. For example, a portion of circuit elements 2220c of the peripheral circuit region PERI may provide the page buffer, and the bitline 2360c may be electrically connected to the circuit elements 2220c, providing the page buffer through an upper bonding metal 2370c of the first cell region CELL1 and an upper bonding metal 2270c of the peripheral circuit region PERI.

Continuing to refer to FIG. 14, in the wordline bonding region WLBA, the wordlines 2330 of the first cell region CELL1 may extend in a second direction (X-axis direction), parallel to the upper surface of the second substrate 2310, and may be connected to a plurality of cell contact plugs 2340 (2341 to 2347). A first metal interconnection 2350b and a second metal interconnection 2360b may be sequentially connected to upper portions of the cell contact plugs 2340, connected to the wordlines 2330. In the wordline bonding region WLBA, the cell contact plugs 2340 may be connected to the peripheral circuit region PERI through an upper bonding metal 2370b of the first cell region CELL1 and an upper bonding metal 2270b of the peripheral circuit region PERI.

The cell contact plugs 2340 may be electrically connected to a row decoder included in the peripheral circuit region PERI. For example, a portion of circuit elements 2220b of the peripheral circuit region PERI may provide the row decoder, and the cell contact plugs 2340 may be electrically connected to the circuit elements 2220b, providing the row decoder through the upper bonding metal 2370b of the first cell region CELL1 and the upper bonding metal 2270b of the peripheral circuit region PERI. In an example embodiment, operation voltages of the circuit elements 2220b, providing the row decoder, may be different from operation voltages of the circuit elements 2220c, providing the page buffer. For example, the operation voltages of circuit elements 2220c, providing the page buffer, may be higher than operation voltages of the circuit elements 2220b, providing the row decoder.

Similarly, in the wordline bonding region WLBA, the wordlines 2430 of the second cell region CELL2 may extend in a second direction (X-axis direction), parallel to the upper surface of the third substrate 2410, and may be connected to a plurality of cell contact plugs 2440 (2441 to 2447). The cell contact plugs 2440 may be connected to the peripheral circuit region PERI through an upper metal pattern of the second cell region CELL2, lower and upper metal patterns of the first cell region CELL1, and a cell contact plug 2348.

In the wordline bonding region WLBA, the upper bonding metal 2370b may be formed in the first cell region CELL1, and the upper bonding metal 2270b may be formed in the peripheral circuit region PERI. The upper bonding metal 2370b of the first cell region CELL1 and the upper bonding metal 2270b of the peripheral circuit region PERI may be electrically connected to each other using the bonding method. The upper bonding metal 2370b and the upper bonding metal 2270b may be formed of aluminum, copper, tungsten, or the like.

In the external pad bonding region PA, a lower metal pattern 2371e may be formed in a lower portion of the first cell region CELL1, and an upper metal pattern 2472a may be formed in an upper portion of the second cell region CELL2. In the external pad bonding region PA, the lower metal pattern 2371e of the first cell region CELL1 and the upper metal pattern 2472a of the second cell region CELL2 may be connected to each other using the bonding method. Similarly, an upper metal pattern 2372a may be formed in an upper portion of the first cell region CELL1, and an upper metal pattern 2272a may be formed in an upper portion of the peripheral circuit region PERI. The upper metal pattern 2372a of the first cell region CELL1 and the upper metal pattern 2272a of the peripheral circuit region PERI may be connected to each other using the bonding method.

Common source line contact plugs 2380 and 2480 may be disposed in the external pad bonding region PA. The common source line contact plugs 2380 and 2480 may be formed of a conductive material such as a metal, a metal compound, doped polysilicon, or the like. The common source line contact plug 2380 of the first cell region CELL1 may be electrically connected to the common source line 2320, and the common source line contact plug 2480 of the second cell region CELL2 may be electrically connected to the common source line 2420. A first metal interconnection 2350a and a second metal interconnection 2360a may be sequentially stacked on the common source line contact plug 2380 of the first cell region CELL1, and a first metal interconnection 2450a and a second metal interconnection 2460a may be sequentially stacked on the common source line contact plug 2480 of the second cell region CELL2.

Input/output pads 2205, 2405, and 2406 may be disposed in the external pad bonding region PA. Referring to FIG. 14, a lower insulating film 2201 may cover a lower surface of the first substrate 2210, and a first input/output pad 2205 may be formed on the lower insulating film 2201. The first input/output pad 2205 may be connected to at least one of the plurality of circuit elements 2220a disposed in the peripheral circuit region PERI through a first input/output contact plug 2203, and may be isolated from the first substrate 2210 by the lower insulating film 2201. In addition, a side insulating film may be disposed between the first input/output contact plug 2203 and the first substrate 2210 to electrically isolate, from each other, the first input/output contact plug 2203 and the first substrate 2210.

An upper insulating film 2401, covering the upper surface of the third substrate 2410, may be formed on an upper portion of third substrate 2410. A second input/output pad 2405 or a third input/output pad 2406 may be disposed on the upper insulating film 2401. The second input/output pad 2405 may be connected to at least one of the plurality of circuit elements 2220a disposed in the peripheral circuit region PERI through second input/output contact plugs 2403 and 2303, and the third input/output pad 2406 may be connected to at least one of the plurality of circuit elements 2220a disposed in the peripheral circuit region PERI through third input/output contact plugs 2404 and 2304.

In an example embodiment, the third substrate 2410 may not be disposed in a region in which an input/output contact plug is disposed. For example, as illustrated in B, the third input/output contact plug 2404 may be isolated from the third substrate 2410 in a direction, parallel to the upper surface of the third substrate 2410, and may pass through an interlayer insulating layer 2415 of the second cell region CELL2 to be connected to the third input/output pad 2406. In this case, the third input/output contact plug 2404 may be formed using various processes.

As an example, as illustrated in B1, the third input/output contact plug 2404 may extend in a third direction (Z-axis direction), and may have a larger diameter toward the upper insulating layer 2401. That is, while a diameter of the channel structure CH described with reference to A1 is formed to decrease toward the upper insulating film 2401, a diameter of the third input/output contact plug 2404 may be formed to increase toward the upper insulating film 2401. For example, the third input/output contact plug 2404 may be formed after the second cell region CELL2 and the first cell region CELL1 are bonded to each other using the bonding method.

In addition, as an example, as illustrated in B2, the third input/output contact plug 2404 may extend in the third direction (Z-axis direction), and may have a smaller diameter toward the upper insulating film 2401. That is, the diameter of the third input/output contact plug 2404 may be formed to decrease toward the upper insulating layer film in the same manner as the channel structure CH. For example, the third input/output contact plug 2404 may be formed together with the cell contact plugs 2440 before the second cell region CELL2 and the first cell region CELL1 are bonded to each other.

In another example embodiment, the input/output contact plug may be disposed to overlap the third substrate 2410. For example, as illustrated in C, the second input/output contact plug 2403 may be formed to pass through the interlayer insulating layer 2415 of the second cell region CELL2 in the third direction (Z-axis direction), and may be electrically connected to the second input/output pad 2405 through the third substrate 2410. In this case, a connection structure between the second input/output contact plug 2403 and the second input/output pad 2405 may be implemented in various manners.

As an example, as illustrated in C1, an opening 2408, passing through the third substrate 2410, may be formed, and the second input/output contact plug 2403 may be directly connected to the second input/output pad 2405 through the opening 2408 formed in the third substrate 2410. In this case, as illustrated in C1, the second input/output contact plug 2403 may have a larger diameter toward the second input/output pad 2405. However, such a configuration is exemplary, and the second input/output contact plug 2403 may also have a smaller diameter toward the second input/output pad 2405.

As an example, as illustrated in C2, an opening 2408, passing through the third substrate 2410, may be formed, and a contact 2407 may be formed in the opening 2408. One end of the contact 2407 may be connected to the second input/output pad 2405 and the other end may be connected to the second input/output contact plug 2403. Accordingly, the second input/output contact plug 2403 may be electrically connected to the second input/output pad 2405 through the contact 2407 in the opening 2408. In this case, as illustrated in C2, the contact 2407 may have a larger diameter toward the second input/output pad 2405, and the second input/output contact plug 2403 may have a smaller diameter toward the second input/output pad 2405. For example, the third input/output contact plug 2403 may be formed together with the cell contact plugs 2440 before the second cell region CELL2 and the first cell region CELL1 are bonded to each other, and the contact 2407 may be formed after the second cell region CELL2 and the first cell region CELL1 are bonded to each other.

In addition, as an example, as illustrated in C3, a stopper 2409 may be further formed on an upper surface of the opening 2408 of the third substrate 2410, as compared to C2. The stopper 2409 may be a metal interconnection formed on a layer the same as the common source line 2420. However, such a configuration is exemplary, and the stopper 2409 may be a metal interconnection formed on a layer the same as at least one of the wordlines 2430. The second input/output contact plug 2403 may be electrically connected to the second input/output pad 2405 through the contact 2407 and the stopper 2409.

In a similar manner to the second and third input/output contact plugs 2403 and 2404 of the second cell region CELL2, the second and third input/output contact plugs 2303 and 2304 of the first cell region CELL1 may respectively have a smaller diameter toward the lower metal pattern 2371e, or may respectively a larger diameter toward the lower metal pattern 2371e.

In some example embodiments, a slit 411 may be formed in the third substrate 2410. For example, the slit 2411 may be formed in an arbitrary position of the external pad bonding region PA. In an example embodiment, as illustrated in D, the slit 2411 may be positioned between second input/output pad 2405 and the cell contact plugs 2440 in a plan view. However, such a configuration is exemplary, and the slit 2411 may be formed such that the second input/output pad 2405 is positioned between the slit 2411 and the cell contact plugs 2440 in a plan view.

As an example, as illustrated in D1, the slit 2411 may be formed to pass through the third substrate 2410. The slit 2411 may be used, for example, to prevent the third substrate 2410 from being slightly cracked when the opening 2408 is formed. However, such a configuration is exemplary, and the slit 2411 may be formed to a depth of about 60 to 70% with respect to a thickness of the third substrate 2410.

In addition, as an example, as illustrated in D2, a conductive material 2412 may be formed in the slit 2411. The conductive material 2412 may be used, for example, to discharge, to the outside, leakage current generated during driving of circuit elements in the external pad bonding region PA. In this case, the conductive material 2412 may be connected to an external ground line.

In addition, as an example, as illustrated in D3, an insulating material 2413 may be formed in the slit 2411. The insulating material 2413 may be formed to, for example, electrically isolate, from the wordline bonding region WLBA, the second input/output pad 2405 and the second input/output contact plug 2403 disposed in the external pad bonding region PA. The insulating material 2413 may be formed in the slit 2411, thereby blocking the voltage provided through the second input/output pad 2405 from affecting a metal layer disposed on the third substrate 2410 in the wordline bonding region WLBA.

In some example embodiments, the first to third input/output pads 2205, 2405, and 2406 may be selectively formed. For example, the nonvolatile memory device 2500 may be implemented to include only the first input/output pad 2205 disposed on an upper portion of the first substrate 2201, to include only the second input/output pad 2205 disposed on an upper portion of the third substrate 2410, or to include only the third input/output pad 2406 disposed on an upper portion of the upper insulating film 2401.

In some example embodiments, at least one of the second substrate 2310 of the first cell region CELL1 and the third substrate 2410 of the second cell region CELL2 may be used as a sacrificial substrate, and may be entirely or partially removed before or after a bonding process is performed. An additional film may be deposited after substrate removal. For example, the second substrate 2310 of the first cell region CELL1 may be removed before or after bonding of the peripheral circuit region PERI and the first cell region CELL1, and an insulating film, covering an upper surface of the common source line 2320, or a conductive film for connection may be formed. Similarly, the third substrate 2410 of the second cell region CELL2 may be removed before or after bonding of the first cell region CELL1 and the second cell region CELL2, and the upper insulating film 2401, covering an upper surface of the common source line 2420, or a conductive film for connection may be formed.

According to an embodiment of the present invention, in the virtual cell mode, the operation method of a non-volatile memory device includes electrically connecting the NMOS diode structured current mirror connected to the PAD to a gate of the bitline shield transistor (SHLDT) of the page buffer. The gate voltage (Vvcp) of the NMOS diode structured current mirror may be applied to the gate of the bitline shield transistor (SHLDT) of the page buffer through the switch (152-1 of FIG. 6 or 184 of FIG. 10). After applying the gate voltage as a reference to the Unit Gain_3Stage_Source Follower Generator, the gate of the bitline shield transistor (SHLDT) is charged with the current mirror gate voltage in the Source Follower Stage, composed of the bitline shut-off transistor (BLSHFT) and the bitline shield transistor (SHLDT). Then, by applying the gate voltage of the bitline shut-off transistor (BLSHFT) from the generator (152-2 of FIG. 6 or 183 of FIG. 10), corresponding to the mirrored current, to the BLSHFT of the page buffer, the gate and drain voltages of the SHLDT can be biased identically to the current mirror circuit (151 of FIG. 6 or 181 of FIG. 10), thereby emulating the subthreshold cell current.

In an example embodiment, the width/length of the diode transistor DT in the current mirror 151 or the width/length of the first transistor M1 in the current forcing circuit 181 and the width/length of the bitline shield transistor (SHLDT) used in the page buffer PB are the same. In an embodiment, the number of the third transistors M3 and the number of the fourth transistors M4 can be increased while maintaining a ratio that satisfies normal circuit operation. In an embodiment, the drain voltage of the bitline shield transistor (SHLDT) can be indirectly biased by the gate voltage of the bitline shut-off transistor (BLSHFT). In an embodiment, the non-volatile memory device can be equipped with a switch for selecting between a test mode (e.g., the virtual cell mode) and a user mode (e.g., the normal operation mode). In an embodiment, to stably set up the bias, the generator can be enabled in advance during the virtual cell mode, ensuring a sufficient setup time.

In a nonvolatile memory device, a storage device including the same, and a method of testing the same according to an example embodiment of the present inventive concept, a cell current may be replicated to a page buffer using a current mirror in a virtual cell mode.

In the nonvolatile memory device, the storage device including the same, and the method of testing the same according to an example embodiment of the present inventive concept, the cell current may be replicated in the virtual cell mode, thereby confirming robustness of current sensing of the page buffer.

While example embodiments have been illustrated and described above, it will be apparent to those skilled in the art that modifications and variations could be made without departing from the scope of the present inventive concept as defined by the appended claims.

What is claimed is:

1. A nonvolatile memory device comprising:
   a page buffer connected to a bitline, and configured to allow a replicated current to flow through a ground terminal in response to a first control signal and a second control signal;
   a control signal generator configured to output the first control signal and the second control signal to the page buffer; and
   a current mirror configured to output a control voltage corresponding to a bias current in a virtual cell mode,
   wherein the control voltage corresponds to the first control signal.

2. The nonvolatile memory device of claim 1, wherein the page buffer includes:
   a first transistor including a source connected to the ground terminal, a drain, and a gate configured to receive the first control signal;
   a second transistor including a source connected to the drain of the first transistor, a drain, and a gate configured to receive the second control signal; and
   a third transistor including a source connected to the drain of the second transistor, a drain connected to a sensing node, and a gate configured to receive a bitline connection control signal.

3. The nonvolatile memory device of claim 2, wherein the page buffer further includes:
   a fourth transistor including a source connected to the bitline, a drain connected to the drain of the first transistor, and a gate configured to receive a bitline selection signal.

4. The nonvolatile memory device of claim 2, wherein the control signal generator includes:
   a switch configured to output the control voltage as the first control signal to the gate of the first transistor in the virtual cell mode; and
   a signal generator configured to generate the second control signal such that a voltage of the drain of the first transistor is equal to the control voltage in the virtual cell mode.

5. The nonvolatile memory device of claim 4, wherein a difference between a level of the second control signal and a level of the voltage of the drain of the first transistor corresponds to a threshold voltage of the second transistor in the virtual cell mode.

6. The nonvolatile memory device of claim 4, wherein the current mirror includes:
   a current source configured to output the bias current; and
   a diode transistor connected between the current source and the ground terminal, the diode transistor having a gate connected to a drain of the diode transistor, the gate configured to output the control voltage.

7. The nonvolatile memory device of claim 2, wherein the control signal generator includes:
   a bitline shielding control signal generator configured to generate a bitline shielding control signal;
   a bitline shut-off control signal generator configured to generate a bitline shut-off control signal;

a first switch configured to output, as the first control signal, one of the control voltage and the bitline shielding control signal; and a second switch configured to output, as the second control signal, one of the bitline shielding control signal and the bitline shut-off control signal.

8. The nonvolatile memory device of claim 7, wherein the current mirror is configured to force the bias current from an internal circuit of the nonvolatile memory device.

9. The nonvolatile memory device of claim 7, wherein the current mirror is configured to force the bias current from a pad connected to an external device.

10. The nonvolatile memory device of claim 7, wherein the current mirror includes:

a comparator configured to compare a voltage of a first node connected to the first switch with a voltage of a second node;

a fourth transistor including a drain connected to a pad and the first node, a source connected to the ground terminal, and a gate connected to the first node;

a fifth transistor including a drain connected to a current source, a source connected to the ground terminal, and a gate configured to receive an output voltage of the comparator;

a sixth transistor including a source connected to a power terminal, a drain connected to the second node, and a gate configured to output a bitline shut-off input signal to the bitline shut-off control signal generator and connected to the drain of the fifth transistor; and a seventh transistor including a drain connected to the second node, a source connected to the ground terminal, and a gate connected to the first node.

11. A storage device comprising:

a nonvolatile memory package including at least one nonvolatile memory device; and a controller configured to control the nonvolatile memory package, wherein the at least one nonvolatile memory device includes a plurality of page buffers connected to a memory cell array through a plurality of bitlines, and wherein the at least one nonvolatile memory device is configured to allow, in a virtual cell mode, a replicated current flowing through each of the plurality of page buffers by using a current mirror connected to a pad, and wherein the replicated current corresponds to a cell current of each memory cell in the memory cell array flowing through each of the plurality of bitlines.

12. The storage device of claim 11, wherein the at least one nonvolatile memory device is configured to replicate, in the virtual cell mode, a subthreshold current to a first control transistor of each of the plurality of page buffers.

13. The storage device of claim 12, wherein the current mirror is configured to output a gate voltage to a gate of the first control transistor.

14. The storage device of claim 13, wherein a drain of the first control transistor is configured to be indirectly biased using a control voltage corresponding to the replicated current.

15. The storage device of claim 14, wherein each of the plurality of page buffers further includes:

a second control transistor including a gate configured to receive, in the virtual cell mode, the control voltage such that the biasing of the drain of the first control transistor is adjusted.

16. A method of testing a nonvolatile memory device including a memory cell array connected to a page buffer through a bitline, the method comprising:

electrically connecting, in a virtual cell mode, a current mirror bias to a gate of a first control transistor of the page buffer; and applying a test signal, corresponding to the current mirror bias, to a gate of a second control transistor of the page buffer so as to bias a drain of the first control transistor.

17. The method of claim 16, further comprising:

receiving a bias current, corresponding to the current mirror bias, from a pad connected to an external device.

18. The method of claim 16, further comprising:

generating a bias current, corresponding to the current mirror bias, from an internal circuit of the nonvolatile memory device.

19. The method of claim 16, further comprising:

generating the test signal corresponding to the current mirror bias.

20. The method of claim 16, further comprising:

in the virtual cell mode, performing a sensing operation corresponding to the bitline, wherein the performing of the sensing operation is performed without a memory cell of the memory cell array.

* * * * *